(12) United States Patent
Hofmann et al.

(10) Patent No.: US 7,075,148 B2
(45) Date of Patent: Jul. 11, 2006

(54) SEMICONDUCTOR MEMORY WITH VERTICAL MEMORY TRANSISTORS IN A CELL ARRAY ARRANGEMENT WITH 1-2F$^2$ CELLS

(75) Inventors: Franz Hofmann, München (DE); Erhard Landgraf, München (DE); Richard Johannes Luyken, München (DE); Thomas Schulz, Austin, TX (US); Michael Specht, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/073,214

(22) Filed: Mar. 5, 2005

(65) Prior Publication Data

US 2005/0199912 A1    Sep. 15, 2005

Related U.S. Application Data

(63) Continuation of application No. PCT/EP03/09296, filed on Aug. 21, 2003.

(30) Foreign Application Priority Data

Sep. 5, 2002   (DE) ................. 102 41 173

(51) Int. Cl.
H01L 29/76    (2006.01)
H01L 29/94    (2006.01)
H01L 31/062   (2006.01)
H01L 31/113   (2006.01)
H01L 31/119   (2006.01)

(52) U.S. Cl. ............. 257/331; 257/330; 257/329; 257/328; 257/316; 257/401

(58) Field of Classification Search ............. 257/314, 257/315, 316, 328, 329, 330, 331, 401
See application file for complete search history.

(56) References Cited

U.S. PATENT DOCUMENTS

| 4,774,556 | A |   | 9/1988 | Fujii et al. |
| 5,302,843 | A | * | 4/1994 | Yamazaki ............... 257/296 |
| 5,508,544 | A | * | 4/1996 | Shah .................... 257/316 |
| 5,721,442 | A | * | 2/1998 | Hong .................... 257/316 |
| 5,821,591 | A | * | 10/1998 | Krautschneider et al. ... 257/390 |
| 5,869,369 | A | * | 2/1999 | Hong .................... 438/259 |
| 6,285,596 | B1 |   | 9/2001 | Miura et al. |
| 6,444,525 | B1 | * | 9/2002 | Lee ...................... 438/259 |
| 6,768,165 | B1 |   | 7/2004 | Eitan |

FOREIGN PATENT DOCUMENTS

| EP | 1 341 239 A1 | 9/2003 |
| WO | WO 99/07000 | 2/1999 |
| WO | WO 02/15278 | 2/2002 |

OTHER PUBLICATIONS

German Patent Office Examination Report dated May 20, 2003.

(Continued)

Primary Examiner—Minhloan Tran
Assistant Examiner—Victor A. Mandala, Jr.
(74) Attorney, Agent, or Firm—Patterson & Sheridan, L.L.P.

(57) ABSTRACT

The invention relates to a semiconductor memory having a multiplicity of memory cells, each of the memory cells having N (e.g., four) vertical memory transistors with trapping layers. Higher contact regions are formed in higher semiconductor regions extending obliquely with respect to the rows and columns of the cell array, the gate electrode generally being led to the step side areas of the higher semiconductor region. A storage density of 1-2F$^2$ per bit can thus be achieved.

21 Claims, 3 Drawing Sheets

OTHER PUBLICATIONS

International Search Report dated Jul. 5, 2004.
International Preliminary Examination Report dated Dec. 17, 2004.
International Preliminary Examination Report dated Jan. 31, 2005.
Boaz Eitan et al., "NROM: A Novel Localized Trapping, 2-Bit Nonvolatile Memory Cell," IEEE Electron Device Letters, vol. 21, No. 11, Nov. 2000, pp. 543-545.
PCT International Preliminary Examination Report dated Jan. 31, 2005.

* cited by examiner

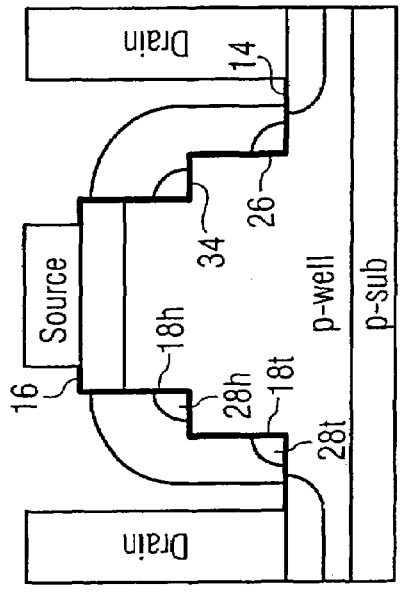
FIG 1A
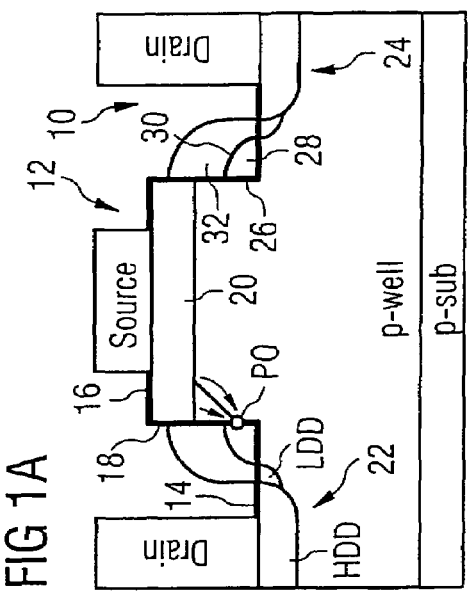
FIG 1B
FIG 1C
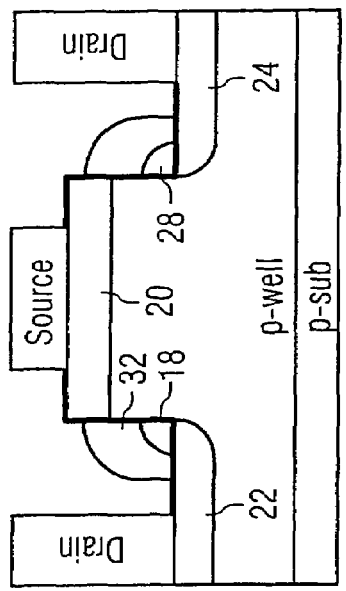
FIG 1D

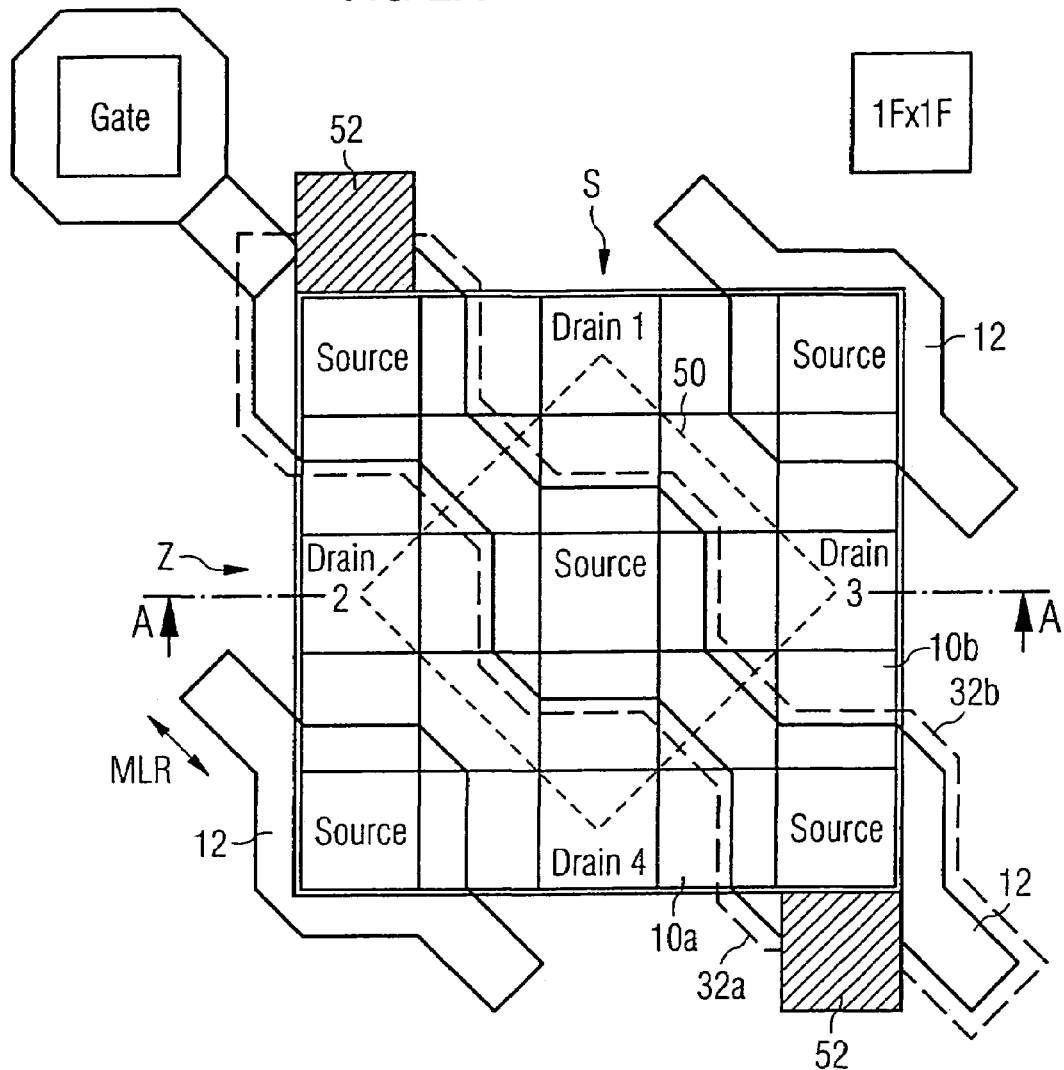
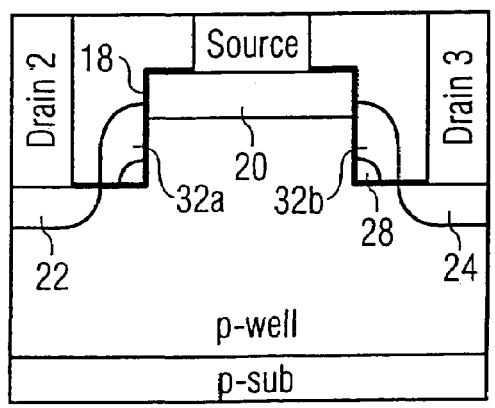

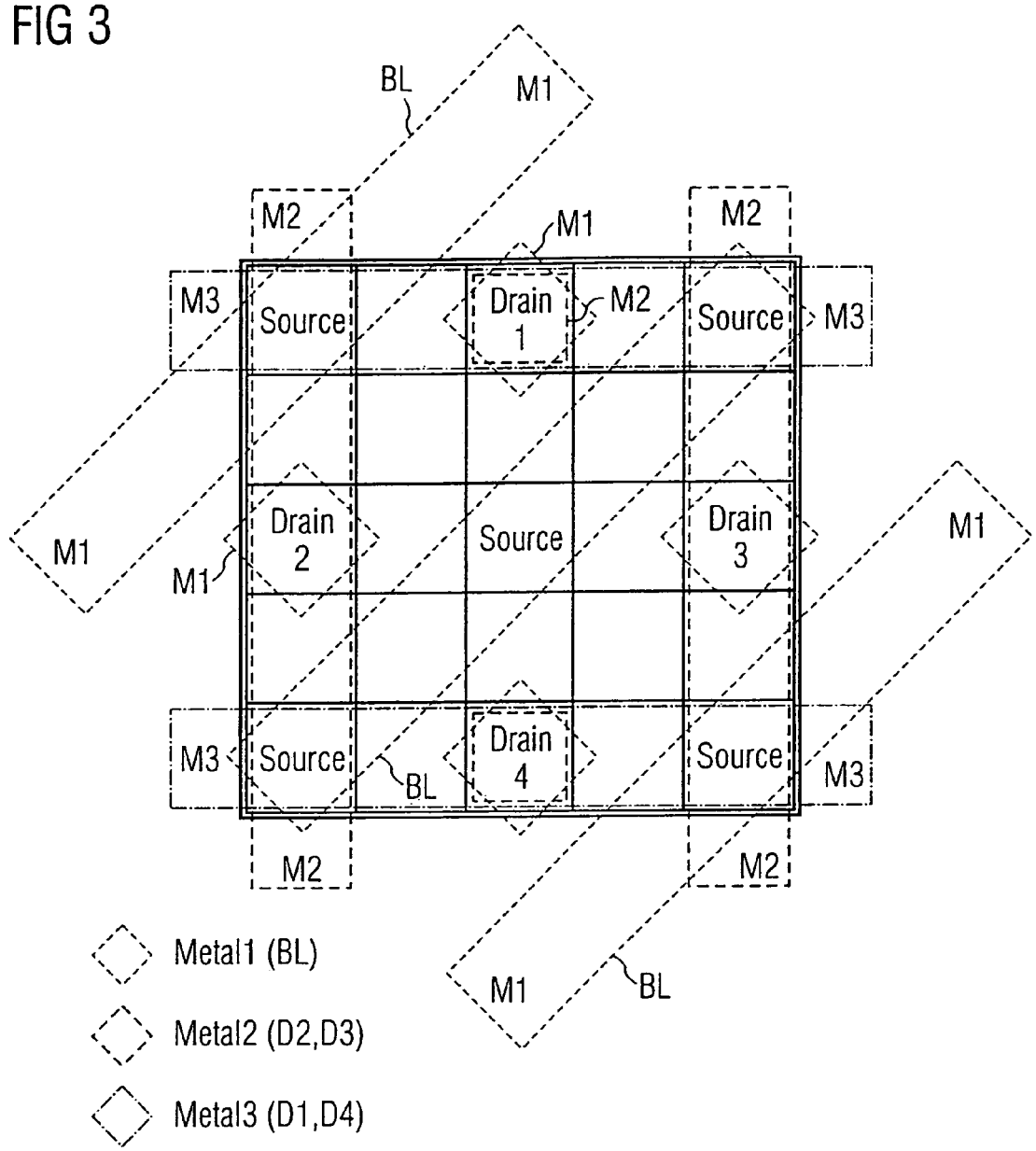

SEMICONDUCTOR MEMORY WITH VERTICAL MEMORY TRANSISTORS IN A CELL ARRAY ARRANGEMENT WITH 1-2F² CELLS

CROSS-REFERENCE TO RELATED APPLICATIONS

This application is a continuation of co-pending PCT patent application No. PCT/EP03/09296, filed 21 Aug. 2003, which claims the benefit of German patent application serial number DE 102 41 173.5, filed 5 Sep. 2002. Each of the aforementioned related patent applications is herein incorporated by reference in their entireties.

BACKGROUND OF THE INVENTION

1. Field of the Invention

The invention relates to a semiconductor memory having a multiplicity of memory cells.

2. Description of the Related Art

Nonvolatile semiconductor memory elements are known in a multiplicity of different embodiments. By way of example, programmable read-only memory (PROM), erasable programmable read-only memory (EPROM), electrically erasable programmable read-only memory (EEPROM), flash memories, and also SONOS memories are used depending on the application. They differ in particular in terms of erasure option, programmability and programming time, retention time, storage density, and also their fabrication costs. A low fabrication price associated with a minimum of further options has the highest priority for a multiplicity of applications. It would be desirable, in particular, to have available a particularly inexpensive memory element which is electrically programmable at least once at the lowest possible voltages of less than 10 V, having a retention time in the region of about 10 years, and is compatible with present-day complementary metal-oxide semiconductor (CMOS) technology with the least possible changes.

A known nonvolatile semiconductor memory which is compatible with present-day CMOS technology is described, for example, in the European patent application having the application number EP 02 004 568.8. In this application, each memory cell of the semiconductor memory has a planar transistor (planar MOSFET), and a trapping layer is provided in a cutout of the (control) gate section. Hot electrons that can be generated in the transistor channel as a result of suitable potential conditions at the transistor terminals can overcome the thin gate oxide layer and be trapped by the trapping layer. The presence of the electrons trapped in the trapping layer brings about a shift in the characteristic curve of the transistor, which is manifested in particular by a different threshold voltage. The difference in the threshold voltage can be utilized in a known manner for writing a "bit," since it can be determined by means of a read step.

What is disadvantageous, however, about this known memory concept is the limited scalability of the memory transistors, which makes it difficult to use this concept to fabricate high-density semiconductor memories. Consequently, the main area of application for these conventional memory transistors is in logic circuits or "system on chip" circuits (SOC circuits) with a low storage density.

A further memory transistor, which accords best of all with the requirements mentioned in the introduction, is a transistor fabricated according to the SONOS concept such as is described by Eitan et al. in "NROM: A novel localized trapping, 2-bit nonvolatile Memory Cell", IEEE Electron Device Letters, Vol. 21, No. 11, November 2000, pages 543–545. However, this memory concept also has disadvantages with regard to its scalability, so that obtaining a high-density or highly compact arrangement of memory transistors with very small dimensions is difficult. The smallest cell areas that can be achieved in the case of such NROMs are typically $2F^2$ in the ideal case, where F represents the smallest feature size of the semiconductor memory. In practice, only $3F^2$ can be achieved on account of technology-dictated safety margins.

Therefore, there is a need for a semiconductor memory having a multiplicity of memory cells that permits a high-density cell arrangement in conjunction with simple fabrication.

SUMMARY OF THE INVENTION

Embodiments of the invention provide a semiconductor memory having a multiplicity of memory cells. Each of the memory cells includes a semiconductor layer arranged on a substrate, the semiconductor surface of the semiconductor layer having at least one step between a deeper semiconductor region and a semiconductor region that is higher in the direction of the normal to the substrate, and N (e.g., four) conductively doped deeper contact regions formed in the deeper semiconductor region, and a conductively doped higher contact region formed in the higher semiconductor region, each of the deeper contact regions being electrically connected to precisely one adjoining deeper contact and each of the higher contact regions being electrically connected to precisely one adjoining higher contact. The memory cells further include N (e.g., four) channel regions extending in the semiconductor layer between the deeper contact region and the higher contact region, at least one electrically insulating trapping layer designed for trapping and emitting charge carriers, the trapping layer being arranged on a gate oxide layer adjoining the channel regions, at least one gate electrode for controlling the electrical conductivity of the channel region, and a control oxide layer being arranged between the gate electrode and the trapping layer.

Embodiments of the invention may further provide a semiconductor memory, having a higher semiconductor region, a deeper semiconductor region, the higher semiconductor region being vertically positioned away from a substrate surface a greater distance than the deeper semiconductor region, and a step positioned generally normal to a substrate surface, the step being positioned between the higher semiconductor region and the deeper semiconductor region. The semiconductor memory further includes a plurality of doped higher contacts positioned in electrical communication with the higher semiconductor region, a plurality of doped deeper contacts positioned in electrical contact with the deeper semiconductor region, and at least one channel region connecting the doped deeper contacts to the plurality of doped higher contacts. The semiconductor memory further includes at least one electrically insulating trapping layer positioned on a gate oxide layer connecting to the at least one channel region, at least one gate electrode configured to control the conductivity of the at least one channel region, and a control oxide layer positioned between the at least one gate electrode and the at least one trapping layer, wherein the deeper contacts and the higher contacts are arranged in a matrix cell array.

Embodiments of the invention may further provide a semiconductor memory that includes a higher semiconductor region, a deeper semiconductor region, the higher semiconductor region being vertically positioned away from a substrate surface a greater distance than the deeper semiconductor region, and a step positioned generally normal to a substrate surface, the step being positioned between the higher semiconductor region and the deeper semiconductor region. The semiconductor memory further includes a plurality of doped higher contacts positioned in electrical communication with the higher semiconductor region, a plurality of doped deeper contacts positioned in electrical contact with the deeper semiconductor region, at least one channel region connecting the doped deeper contacts to the plurality of doped higher contacts, and at least one electrically insulating trapping layer positioned on a gate oxide layer connecting to the at least one channel region. The semiconductor memory further includes at least one gate electrode configured to control the conductivity of the at least one channel region, and a control oxide layer positioned between the at least one gate electrode and the at least one trapping layer, wherein the deeper contacts and the higher contacts are arranged in a matrix cell array.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1(a) shows a schematic sectional view through a memory cell of a first preferred embodiment of a semiconductor memory according to the invention, the sectional plane running perpendicular to the substrate plane;

FIG. 1(b) shows a schematic sectional view of a memory cell of a second preferred embodiment with a double step;

FIG. 1(c) shows a schematic sectional view of a memory cell in accordance with a third preferred embodiment with the deeper contact region having been advanced;

FIG. 1(d) shows a schematic sectional view of a memory cell in accordance with a third preferred embodiment with a continuous ONO layer stack;

FIG. 2(a) shows a schematic plan view of a cell array arrangement of a preferred embodiment of the semiconductor memory according to the invention, the cell array arrangement being illustrated on the basis of a superimposition of essential process masks;

FIG. 2(b) shows a schematic sectional view along the line A—A of FIG. 2(a); and

FIG. 3 shows a schematic plan view of the embodiment illustrated in FIG. 2(a) with the illustration of the masks used for the metal 1, metal 2 and metal 3 planes.

DETAILED DESCRIPTION OF THE PREFERRED EMBODIMENT

The semiconductor memory according to one embodiment of the invention uses a so-called vertical transistor concept for the memory transistors. In this case, one of the contact regions, i.e., one of the memory transistor contacts, is arranged in a deeper semiconductor region and the second contact region (the second memory transistor contact) is arranged in a higher semiconductor region. By way of example, one contact region of the memory transistor is situated in a deeper semiconductor region that has been removed with respect to a higher contact region by means of a mesa etching step.

The higher contact region is arranged in the higher semiconductor region, with a step being provided between the two semiconductor regions. The distance between a deeper surface region of the deeper semiconductor region with respect to a substrate plane is thus less than the corresponding distance of a higher surface region of the higher semiconductor region. In other words, in the direction of the normal to the semiconductor substrate, the surface region of the higher semiconductor region is further away from the substrate than the surface region of the deeper semiconductor region. The consequence of this is that the transistor channel extending between the deeper and higher contact regions does not merely run parallel to the substrate plane, but rather has a vertical component.

A thin gate oxide layer is arranged along the surface of the channel region in a customary manner. A part of the gate oxide layer is adjoined by a so-called trapping layer designed for trapping and emitting charge carriers. The trapping layer generally has a large number of defects or "trap states" in which trapped charge carriers (electrons or holes) can be permanently stored. The trapping layer is surrounded by a control oxide layer on its surfaces that do not adjoin the gate oxide layer, so that it is completely enveloped or surrounded by oxide layers. The trapping layer generally includes a nitride layer, which may be a silicon nitride layer, so that an oxide-nitride-oxide layer sequence (so-called ONO stack) results in section through the memory transistor.

A (control) gate electrode is arranged on the control oxide layer and can be used to control the electrical conductivity of the transistor channel by way of the field effect. The gate electrode, in regions, preferably also adjoins the gate oxide layer arranged on the channel region, so that the conductivity of a section of the transistor channel can be controlled directly by the gate electrode.

A potential difference applied between the deeper and higher contact regions of the memory transistor preferably brings about a field line profile between the contact regions in which electric field lines run from the transistor channel through the gate oxide layer into the trapping layer. In contrast to the planar memory transistors as disclosed for example in EP 02 004 568.8 mentioned in the background of this application, the process of injecting channel hot electrons (CHE) is already supported by the orientation of the electric field established between the contact regions. This enables, even at low programming voltages, efficient injection of electrons from the memory transistor channel into the trapping layer, whereby either the required programming voltage or the programming time or the required programming power ($P = U \cdot I \cdot \Delta t$) can be reduced. Furthermore, the step (mesa edge) provided between the deeper and higher contact regions contributes to an increased programming efficiency on account of an increased injection yield of hot electrons. The trapping layer is generally arranged at a comparatively small region of the gate oxide layer. The gate electrode generally directly adjoins the remaining regions of the gate oxide layer.

Each higher contact region arranged in the higher semiconductor region is assigned four deeper contact regions, so that a transistor channel of a vertical memory transistor is formed between each of the deeper contact regions and the higher contact region. By way of example, the higher contact region is a common source contact and the four assigned deeper contact regions are drain contacts of the four memory transistors. In the same way, each of the deeper contact regions are assigned four adjacent higher contact regions between which channel regions run.

The description directed at the construction of the memory cell array of the semiconductor memory according to the invention essentially relates to the cell array arrangement in the interior of the cell array. In edge regions of the cell array, there may be additional memory cells in which case higher contact regions are not surrounded by four deeper contact regions. By way of example, a higher contact region that is assigned only three or two deeper contact regions may be provided at the edge of the memory cell array.

The semiconductor memory according to the invention enables a high packing density since the memory cell area can be scaled independently of the channel length of the transistor on account of the vertical transistor concept. In contrast to planar memory concepts (for example NROMs), the memory transistor according to the invention can be scaled significantly more simply and exhibits smaller short channel effects. The arrangement of the cell array according to the invention enables, in particular, high-density packing densities with 1 to $2F^2$ cells.

Further advantages of the semiconductor memory according to the invention compared with conventional memory components reside in the comparatively low fabrication costs and the simplicity of the fabrication process. Only one additional mask for the mesa or step etching is required compared with a standard CMOS fabrication process. Compared with traditional floating gate memory components containing an electrically conductive floating gate typically made of polysilicon, only a single polysilicon deposition is required if the gate electrode is intended to be composed of highly doped polysilicon.

In embodiments of the invention, the deeper and the higher contacts are arranged in a regular matrix-like cell array with rows and columns and the deeper and the higher contacts are arranged alternately along each of the rows and columns. The deeper and the higher contacts are thus arranged in a generally square grid formed by rows and columns. The deeper and the higher contacts are arranged alternately along each of the rows and each of the columns, a channel region being provided in each case between two adjacent contacts.

In embodiments of the invention, the row longitudinal direction of the rows and the column longitudinal direction of the columns run perpendicular to one another. Rows and columns thus cross at right angles in the cell array. The dimensioning of the deeper and the higher contacts generally corresponds to precisely $1F^2$, where F represents the minimum feature size of the semiconductor memory. Adjacent contacts are generally spaced apart from one another by the distance F in the lateral direction parallel to the substrate plane in order to achieve a maximum cell array density.

In embodiments of the invention, each of the higher semiconductor regions generally has a multiplicity of the higher contact regions. Consequently, a plurality of higher contact regions are arranged in each of the higher semiconductor regions, i.e., "on the mesa". No step or no mesa side wall is present between these higher contact regions. Equally, a multiplicity of deeper contact regions are generally provided in the deeper semiconductor region, there likewise being no step or no mesa side wall provided between the contact regions.

In embodiments of the invention, the higher semiconductor regions extend in mesa longitudinal directions running obliquely with respect to the row and column longitudinal directions. The higher semiconductor region, i.e., the elevated mesa region, accordingly has a longitudinal axis running obliquely with respect to the row longitudinal direction and the column longitudinal direction. Particular preference is attached to an arrangement in which the row longitudinal direction runs perpendicular to the column longitudinal direction and the mesa longitudinal directions are rotated 45° relative to the row longitudinal direction and 45° relative to the column longitudinal direction. Consequently, the mesa longitudinal direction generally runs in a "diagonal direction" over the memory cell array. The higher semiconductor region generally runs through the entire cell array and is surrounded by two adjacent deeper semiconductor regions.

In embodiments of the invention, each of the higher semiconductor regions separates two of the deeper semiconductor regions from one another which adjoin opposite step side areas of the higher semiconductor region. Consequently, each elongated higher semiconductor region is adjoined by two likewise elongated deeper semiconductor regions, the deeper semiconductor regions and the higher semiconductor region in each case containing a multiplicity of the contact regions.

In embodiments of the invention, each of the higher semiconductor regions is assigned a common gate electrode. The gate electrode extends along the opposite step side areas of the higher semiconductor region generally in the form of a polysilicon spacer with the arrangement mentioned in the introduction. In this case, each of the four channel regions which are assigned to one of the higher contact regions is assigned the same common gate electrode. If a multiplicity of higher contact regions are provided in the higher semiconductor region, then all the channel regions which are assigned to these higher contact regions are generally supplied by a single common gate electrode.

In other embodiments of the invention, each of the higher semiconductor regions may be assigned two gate electrodes that are electrically insulated from one another. The gate electrode or the gate electrodes may extend essentially along the mesa longitudinal direction of the higher semiconductor region in a manner adjoining the step side areas thereof. The gate electrodes may be formed in spacer-like fashion by means of a spacer etching step in such a way that they run in a manner adjoining the step side areas of the higher semiconductor region. If two gate electrodes are provided for a higher semiconductor region, a first gate electrode may extend along a first longitudinal side of the elongated higher semiconductor region and a second gate electrode may extend on the opposite longitudinal side of the higher semiconductor region. In this case, the gate electrodes, which may otherwise completely surround the higher semiconductor region in spacer-like fashion, are interrupted at suitable locations, so that the first and the second gate electrode can be contact-connected independently of one another.

A multiplicity of bit lines running perpendicular to the mesa longitudinal directions is generally provided. These bit lines are in each case electrically connected to a multiplicity of the higher contact regions. The bit lines may be led for example in a first metal plane. They intersect the elongated higher semiconductor regions essentially at right angles and run obliquely with respect to the column and row longitudinal directions.

It may be advantageous for the elongated higher semiconductor regions and also the bit lines not to be led rectilinearly over the entire cell array. Instead, the bit lines and the elongated higher semiconductor regions may be led in sawtooth form, by way of example, which will lead to a smaller length variation of the bit line lengths and the lengths of the higher semiconductor regions. This has significant advantages with regard to the evaluation and/or programming electronics to be connected.

The surface regions of the deeper and of the higher semiconductor region run essentially parallel to the substrate plane. The substrate may be a monocrystalline silicon substrate and the semiconductor layer may be a monocrystalline silicon layer.

The surface region of each higher semiconductor region forms a surface of the higher contact region. The higher semiconductor region, i.e., the mesa, thus has a conductive doping along its entire surface region running parallel to the substrate plane, so that the layer adjoining the higher surface region forms the higher contact region.

The surface regions of the deeper and of the higher semiconductor region are connected by a step side area of the step (the mesa edge), which runs essentially perpendicular to the substrate plane. The higher semiconductor region is thus separated from the deeper semiconductor region by a perpendicular mesa edge or side wall.

The trapping layer is spaced apart from the step side area and the surface region of the deeper semiconductor region by the gate oxide layer. The trapping layer is thus preferably arranged in the corner or edge region of the mesa. The trapping layer adjoins both the gate oxide layer arranged on the step side area and the gate oxide layer arranged on the surface region of the deeper semiconductor region. Such a trapping layer can be fabricated in a simple self-aligning manner (without a photo step) by means of a so-called spacer etching. The trapping layer is arranged on the step side area in a manner similar to a spacer known from CMOS technology.

In embodiments of the invention, the surface regions of the deeper and of the higher semiconductor region are connected to one another by a deeper step side area, a higher step side area, and an intermediate area extending between the step side areas. A double step or a double mesa is provided in the case of this embodiment. The step side areas preferably run essentially perpendicular to the substrate plane. The two step side areas adjoin the deeper and the higher surface region, respectively, and are connected by an intermediate area that preferably runs parallel to the substrate plane.

Each of the channel regions is assigned a deeper and a higher one of the trapping layers, the deeper trapping layer being spaced apart from the deeper step side area and the surface region of the deeper semiconductor region by the gate oxide layer and the higher trapping layer being spaced apart from the higher step side area and the intermediate area by the gate oxide layer. Two "bits" can be stored with such a memory transistor if the programming and reading technique known from NROMs is used. In this case, in a known manner, for reading it is necessary to interchange the contact regions compared with the programming operation. In this connection, reference is made to the publication by EITAN et al. cited in the introduction and also to the international patent application WO 99/07000 (PCT/IL98/00363). With regard to the reading and programming method, reference is made to the publication and also to the cited international patent application in their entirety, so that in this respect the publications cited are integral component parts of the overall disclosure of the present application.

In the preferred embodiment, each of the channel regions is assigned two different trapping layers that are spatially separated from one another. The deeper trapping layer is preferably arranged in the edge or corner region in a manner adjoining the deeper surface region and the deeper step side area. The deeper trapping layer is spaced apart from the channel region by the gate oxide layer. The higher trapping layer is preferably arranged in the edge or corner region in a manner adjoining the intermediate area and the higher step side wall, and it in turn is spaced apart from the channel region by the gate oxide layer. The gate electrode generally extends over the two trapping layers, from which it is isolated by the control oxide layer. Between the deeper trapping layer and the higher trapping layer, the gate electrode adjoins the gate oxide layer in regions, so that the electrical conductivity of the transistor channel can be controlled directly in this region.

The deeper contact region extends as far as a step side area of the step, i.e., as far as a side wall of the mesa. Simulations have shown that a particularly efficient mechanism for injection of channel hot electrons into the trapping layer can be achieved if the deeper contact region extends as far as the edge or corner region of the mesa, i.e., as far as the step side area. In the same way, it is furthermore advantageous to form the higher contact region in such a way that it extends as far as the deeper surface region (or an intermediate area). In this case, it is necessary to provide a distance between the deeper contact region and the step side area.

The trapping layer generally includes silicon nitride. In this case, the trapping layer with the silicon dioxide layers surrounding it forms a so-called ONO stack. However, it is also equally possible to use other dielectrics having high dielectric constants ("high-k dielectrics"). Furthermore, so-called "silicon rich oxide," and also undoped polysilicon are suitable for forming the trapping layer.

FIG. 1(a) illustrates, in a schematic sectional view, a first embodiment of a memory transistor that is especially suitable for a semiconductor memory according to the invention. The sectional plane of FIG. 1(a) runs through the memory transistor perpendicular to the substrate plane of the semiconductor substrate p-sub. Arranged on the semiconductor substrate p-sub, which is p-doped for example, is a monocrystalline semiconductor layer p-well, which is lightly p-doped for example. The semiconductor layer p-well is patterned into a deeper semiconductor region 10 and a higher semiconductor region 12, for example by means of a mesa etching step. The deeper semiconductor region 10 has a deeper surface region 14 running essentially parallel to the substrate plane of the substrate p-sub. The higher semiconductor region 12 has a higher surface region 16 likewise arranged essentially parallel to the substrate plane. In the case of the embodiment shown in FIG. 1(a), the higher surface region 16 of the higher semiconductor region 12 is connected to the deeper surface regions 14 by means of step side areas 18.

A higher contact region 20 is formed in a manner adjoining the higher surface region 16 of the higher semiconductor region 12. The highly doped higher contact region 20 constitutes the source contact (SOURCE) of the memory transistor, for example. The section shown in FIG. 1(a) furthermore illustrates two deeper contact regions 22, 24 formed in the deeper semiconductor region 10. The deeper contact regions 22, 24 constitute two of the drain contacts (DRAIN) of the memory transistors, for example. In the embodiment shown in FIG. 1(a), the deeper contact regions 22, 24 have a highly doped region (HDD—highly doped drain) and a more lightly doped contact region (LDD—lightly doped drain) arranged nearer to the higher contact region 12.

The channel regions of the two memory transistors illustrated in FIG. 1(a) extend between the respective deeper contact regions 22, 24 and the higher contact region 20 at the interface of gate oxide layers 26 in the semiconductor layer p-well. The channel region has, at least in regions, a channel direction running perpendicular to the substrate plane, so that the memory transistors are vertical components. The deeper contact regions 22, 24 and also the higher contact region 20 are electrically contacted-connected by means of metal contacts indicated schematically. In the corner or edge region of the mesa, i.e. in the edge formed between the lower surface region 14 and the step side area 18, a trapping layer 28 is arranged in each of the memory transistors. The trapping layer 28 may include silicon nitride, for example, which is spaced apart from the channel region by a silicon dioxide layer (a gate oxide layer 26). The trapping layer 28 may be formed in a self-aligning process (so-called spacer etching) without an additional lithography step.

A control oxide layer 30 is applied to that surface of the trapping layer 28 which does not adjoin the gate oxide layer 26, the trapping layer 28 being isolated from the gate electrode 32 by the control oxide layer. The control oxide layer 30, the trapping layer 28, and the gate oxide layer 26 form a so-called ONO stack. A passivation layer, not specifically illustrated in FIG. 1(a), may generally protect the contact regions and also the gate electrode and electrically insulate these from one another.

A gate electrode 32 is preferably formed from highly doped polysilicon. The gate electrode 32 adjoins a region of the gate oxide layer 26, so that the electrical conductivity of the assigned channel region can be controlled directly. The channel length whose conductivity can be controlled directly by the gate electrode 32 is generally between about 20 nm and about 50 nm. The width of the higher semiconductor region 12 is generally between about 50 nm and about 200 nm, the height difference in the direction of the normal to the substrate between the higher surface region 16 and the deeper surface region 14 generally being between about 50 nm and about 150 nm. However, significantly larger channel lengths or dimensions of up to several μm are also possible.

The functioning of the memory transistor of the memory cell shown in FIG. 1(a) is illustrated for the transistor formed between the contact regions 22 and 20. By means of a forward voltage having a value of less than 10 V, for example, the deeper contact region 22 is positively biased with respect to the higher contact region 20. Furthermore, the gate electrode 32 is positively biased with respect to the higher contact region 20. The memory transistor is driven into its saturation region given suitable potential conditions at the transistor contacts. In the case of such source-drain voltages that are greater than the so-called pinch-off voltage, there is a so-called pinch-off point PO along the transistor channel. The voltage between the deeper contact region 22 and the higher contact region 20 is preferably set in such a way that the pinch-off point PO is situated near the higher contact region 20 at a location in the transistor channel which is opposite the trapping layer 28. In the case of such potential conditions at the transistor contacts, so-called hot electrons (channel hot electrons (CHE)) are generated in particular near the pinch-off point PO. These electrons generally have sufficient energy to overcome the thin gate oxide layer 26 and to be incorporated into the trapping layer 28. As a result of electrons being incorporated into the trapping layer 28, the characteristic curve of the memory transistor is shifted. In particular, the threshold voltage is altered, which can be used in a known manner for programming a "bit".

By virtue of the contact and channel geometry of the memory transistor shown in FIG. 1(a), the electric field lines run between the higher contact region 20 and the deeper contact region 22, in part transversely through the gate oxide layer 26. Consequently, there is an electric field component that supports the injection of channel hot electrons into the trapping layer 28.

Consequently, at source-drain voltages above the pinch-off voltage, charge carriers are efficiently generated by ionization in the channel region between the deeper contact region 22 and the pinch-off point PO. These charge carriers are in turn injected into the trapping layer 28 by means of a suitable gate voltage. All voltages required for this purpose are generally in the range below 10 V. The read-out is generally affected in the inverse direction.

In the case of this vertical concept, the programming efficiency is increased since the yield of hot electrons incorporated in the trapping layer 28 is greater ($>10^{-5}$ of the channel electrons). This is caused in particular by a field compression as a result of the mesa edge and also the required 90° change in direction of the electrons in the edge region. This enables the programming time and/or the programming voltage or power to be significantly reduced, which is desirable in particular for semiconductor memories in mobile use.

FIG. 1(b) shows a second embodiment of a memory cell of a semiconductor memory according to the invention. Features that have already been described in connection with FIG. 1(a) bear the same reference symbols and will not be described again. The embodiment shown in FIG. 1(b) differs from that described above by virtue of a "double step" or double mesa edge between the higher surface region 16 and the deeper surface region 14. Thus, the deeper surface region 14 adjoins a deeper step side area 18t connected to a higher step side area 18h by means of an intermediate area 34. The step side areas 18t, 18h are arranged generally perpendicular to the substrate plane, while the intermediate area 34 runs generally parallel to the substrate plane. Trapping layers 28t, 28h are respectively arranged in the corner or edge regions which are formed by the deeper surface region 14 and the deeper step side area 18t and also the intermediate area 34 and the higher step side area 18h. The trapping layers 28t, 28h are spaced apart from the channel region arranged in the semiconductor layer p-well by a gate oxide layer 26.

Each channel region is assigned two trapping layers 28t, 28h in the case of the embodiment illustrated in FIG. 1(b), so that each memory transistor can store two "bits". In this case, programming and reading are effected analogously to NROMs and described extensively in the publications by Eitan et al. mentioned in the introduction. The gate electrode 32 extends over the deeper 28t and the higher 28h trapping layer, and it directly adjoins the gate oxide 26 in regions between the trapping layers 28t, 28h. Both the gate electrode 32 and the trapping layers 28t, 28h may be patterned by means of a spacer etching.

FIG. 1(c) shows, in diagrammatic cross section, a third embodiment of a memory cell of a semiconductor memory according to the invention. The memory cell is similar to the embodiment described with reference to FIG. 1(a). The present embodiment is different in the formation of the deeper contact regions 22, 24, which extend as far as the step side area 18 in the case of the embodiment illustrated in FIG.

1(c). Simulations have shown that the field line profile established with such an arrangement of the deeper contact region 22 leads to a particularly efficient injection of charge carriers into the trapping layer 28.

FIG. 1(d) illustrates another embodiment of a memory transistor that is especially suitable for a semiconductor memory according to the invention. The memory transistor shown in FIG. 1(d) differs from the previous embodiments by the fact that the trapping layer 28 is not arranged in locally delimited fashion by means of a spacer etching in the mesa side wall. Instead, the trapping layer 28 extends from the deeper contact regions 22, 24 as far as the higher surface region 16 of the higher semiconductor region 12. Consequently, a continuous trapping layer stack, which is preferably an ONO stack, completely covers the entire mesa side wall region and in particular the step side area 18. Such a memory transistor is particularly simple to fabricate since an additional spacer etching step for the layer stack can be dispensed with. Furthermore, the embodiment illustrated in FIG. 1(d) permits the storage of two "bits" in each channel region if the programming and reading technique known from NROMs is used. This programming and reading technique has been described extensively in the publications by B. Eitan et al. cited in the introduction. In this regard, reference is thus made to the disclosure content of the publications in its entirety, which publications in this respect constitute an integral component part of the disclosure of the present application.

FIG. 2(a) shows a schematic plan view of a cell array arrangement of a semiconductor memory according to the invention. The cell array arrangement is illustrated by means of a superimposition of essential masks used in the fabrication process. For the sake of better clarity, all that is shown is a very small memory cell array illustrating only one complete memory cell. This memory cell is indicated by the dashed line designated by 50 and comprises a higher contact region 20 with a higher contact Source (as cooperatively shown in FIG. 2(b)). Furthermore, the memory cell 50 is assigned in each case one quarter of deeper contact regions 22, 24 with deeper contacts Drain 1, Drain 2, Drain 3, Drain 4, which is illustrated in the sectional view along the line A—A of FIG. 2(a) which is shown in FIG. 2(b). A memory transistor channel extends at the gate oxide layer 26 in each case between the higher contact region 20 and the respective deeper contact regions 22, 24. Instead of the memory transistor that is schematically illustrated in section in FIG. 2(b), it is also possible to use other vertical memory transistors, in particular the memory transistors described in connection with FIG. 1.

The deeper contacts Drain 1, Drain 2, Drain 3, Drain 4 and the higher contacts Source are arranged in a square, matrix-like grid comprising rows Z and columns S, a grid element having an edge length of F. F in this case designates the smallest structural dimension of the semiconductor memory. The deeper contacts Drain 1, Drain 2, Drain 3, Drain 4 and the higher contacts Source are arranged alternately along each of the rows Z and columns S of the cell array, so that a deeper contact in each case follows a higher contact. The size of such a smallest cell having the edge dimensions 1F×1F is indicated schematically in FIG. 2(a). The memory cell 50 thus has an area content of $8F^2$.

If memory transistors are used which can store one bit per channel region (for example the memory transistors illustrated in FIG. 1(a) and FIG. 1(c)), then the $8F^2$ cell is designed for storing a total of four bits. However, if memory transistors are used which can store 2 bits per channel region (for example the memory transistors shown in FIG. 1(b) and FIG. 1(d)), then the $8F^2$ cell is designed for storing a total of 8 bits. Consequently, only an area of $1-2F^2$ is taken up per stored "bit".

The higher semiconductor region 12, i.e., the mesa, extends in a mesa longitudinal direction (MLR) obliquely with respect to the row longitudinal direction of the rows Z and the column longitudinal direction of the columns S. In the case of the arrangement shown in FIG. 2(a), the angle between the mesa longitudinal direction MLR and the longitudinal directions of the rows Z and columns S is 45° since a square grid is used. FIG. 2(a) illustrates only one complete higher semiconductor region 12 of a small cell array, which is assigned a total of three higher contacts Source. The adjacent higher semiconductor regions 12 are only indicated schematically, and they are assigned a single higher contact Source. The higher semiconductor region 12 separates two deeper semiconductor regions 10a and 10b from one another. Between one deeper semiconductor region 10a and the higher semiconductor region 12, which is illustrated in the center in FIG. 2(a), a first gate electrode 32a is arranged on the step side area 18 of the higher semiconductor region 12. The gate electrode 32(a) is indicated by a dashed line in FIG. 2(a).

The gate electrode 32a is generally a highly doped polysilicon spacer gate which can be fabricated in a self-aligning manner on the mesa side wall without a mask step (without a photolithography step). Accordingly, the dashed line in FIG. 2(a) is only depicted for illustrating the arrangement of the gate electrode 32a and does not represent a mask of the fabrication process. The conductivity of the transistor channel extending between the deeper contact Drain 2 and the higher contact Source can be controlled by the spacer gate electrode 32a, by way of example. The gate electrode 32a is electrically contact-connected by means of a gate contact Gate, which is indicated at the top left end of the cell array in FIG. 2(a).

A second gate electrode 32b, which is likewise a highly doped polysilicon spacer gate, extends along the opposite step side areas 18 of the higher semiconductor region 12. The spacer gate 32b is designed for controlling the electrical conductivity between the higher contact Source and the deeper contact Drain 3, by way of example. The first gate electrode 32a is electrically insulated from the second gate electrode 32b by means of a (polysilicon) etching step, the etching mask 52 being indicated in FIG. 2(a). The contact terminal for contact-connecting the gate electrode 32b is not illustrated in FIG. 2(a).

Instead of two gate electrodes 32a, 32b that are electrically insulated from one another, it is also possible to use a common gate electrode 32 for both mesa side walls. The additional spacer gate etching step by means of the etching masks 52 is dispensed with in this case. The gate electrodes 32a, 32b represent the word lines of the semiconductor memory.

FIG. 3 shows a plan view of the metallization masks of the memory cell array of FIG. 2, which are illustrated in a manner arranged one above the other. The higher contacts Source are contact-connected by metal lines BL formed in the first metal plane Metal 1. The metal lines BL represent the bit lines of the semiconductor memory. The direction of the bit lines BL preferably runs perpendicular to the mesa longitudinal direction MLR, so that each bit line BL crosses the same higher semiconductor region 12 once at most. In FIG. 3, three adjacent bit lines BL that run parallel to one another are indicated in the first metal plane Metal 1. The bit lines BL for contact-connecting the higher contacts Source are represented by a dotted line in FIG. 3, which is illustrated in the legend for FIG. 3.

The deeper contacts Drain 2 and Drain 3 are preferably contact-connected via the second metal plane Metal 2. For this purpose, two lines M2 running in the column longitudinal direction are provided in the second metal plane Metal 2, these lines being emphasized by a dashed line in FIG. 3. The deeper contacts Drain 2, Drain 3 are contact-connected via the first metal plane Metal 1, which is indicated in FIG. 3. The deeper contacts Drain 3 and Drain 4 are finally electrically contact-connected via lines routed in the third metal plane Metal 3. These lines are preferably arranged perpendicular to the lines routed in the second metal plane and thus run along the row longitudinal direction. In FIG. 3, the lines routed in the third metal plane are emphasized by a dash-dotted line. In this case, Drain 1 and Drain 4 are connected to the third metal plane Metal 3 by means of the first metal plane Metal 1 (via), the second metal plane Metal 2 (via). Consequently, all the deeper contacts Drain 1, Drain 2, Drain 3 and Drain 4 can be electrically addressed separately from one another, so that each bit programmed in the memory transistors can be programmed or read out independently.

As is illustrated in FIG. 3, in the case of the metal layout, the contact holes or vias of the first metal plane Metal 1 and of the second metal plane Metal 2 for the deeper contacts are situated directly above one another and in part less than 1F distance at the bit lines BL. If the contact-connection of the deeper contacts Drain 1–4 via the first metal plane Metal 1 is problematic for example by means of overexposure or other measures, as an alternative a deep contact hole from the second metal plane Metal 2 directly to the deeper contact regions may produce the required electrical connections.

Since the word lines (spacer gates) and bit lines BL are generally oriented at an angle of about 45° with respect to the rows Z and columns S of the cell array, it may be advantageous for global connections to permit the word and bit lines to alternate back and forth by 90° bends in blocks, thus giving rise to a sawtooth-shaped (zigzag) arrangement. This makes it possible to avoid large differences in length between the word and bit lines of the cell array, as a result of which the read-out electronics can be configured more simply.

While the foregoing is directed to embodiments of the present invention, other and further embodiments of the invention may be devised without departing from the basic scope thereof, and the scope thereof is determined by the claims that follow.

What is claimed is:

1. A semiconductor memory having a multiplicity of memory cells, each of the memory cells comprising:

a semiconductor layer arranged on a substrate, a semiconductor surface of the semiconductor layer having at least one step between a relatively deeper semiconductor region and a relatively higher semiconductor region that is higher in a direction normal to the substrate;

N conductively doped deeper contact regions formed in the deeper semiconductor region, and at least one conductively doped higher contact region formed in the higher semiconductor region, each of the doped deeper contact regions being electrically connected to precisely one adjoining deeper contact and each of the doped higher contact regions being electrically connected to precisely one adjoining higher contact;

N channel regions, wherein a separate channel region extends in the semiconductor layer between each doped deeper contact region and the doped higher contact region;

at least one electrically insulating trapping layer designed for trapping and emitting charge carriers, the trapping layer being arranged on a gate oxide layer adjoining the channel regions; and at least one gate electrode for controlling electrical conductivity of the channel region, a control oxide layer being arranged between the gate electrode and the trapping layer, the deeper contacts and the higher contacts being arranged in a regular matrix-like cell array with rows and columns, the deeper contacts and the higher contacts being arranged alternately along each of the rows and columns.

2. The semiconductor memory of claim 1, wherein the direction of the rows and the direction of the columns are perpendicular to one another.

3. The semiconductor memory of claim 1, wherein the higher semiconductor region has a multiplicity of the higher contact regions.

4. The semiconductor memory of claim 1, wherein the higher semiconductor regions extend in mesa longitudinal directions obliquely with respect to a longitudinal direction of the row and columns.

5. The semiconductor memory of claim 4, wherein each of the higher semiconductor regions separates two of the deeper semiconductor regions from one another which adjoin opposite step side areas of the higher semiconductor region.

6. The semiconductor memory of claim 1, wherein each of the higher semiconductor regions are assigned at least one common gate electrode.

7. The semiconductor memory of claim 6, wherein each of the semiconductor regions are assigned at least 2 gate electrodes that are electrically insulated from one another.

8. The semiconductor memory of claim 6, wherein the gate electrodes extend essentially along the mesa longitudinal direction of the higher semiconductor region in a manner adjoining the step side areas thereof.

9. The semiconductor memory of claim 1, wherein a multiplicity of bit lines run perpendicular to mesa longitudinal directions, the bit lines being electrically connected to a multiplicity of the higher contacts.

10. The semiconductor memory of claim 1, wherein the surface region of the deeper semiconductor region and of the higher semiconductor region run essentially parallel to the substrate.

11. The semiconductor memory of claim 1, wherein the surface regions of the deeper semiconductor region and of the higher semiconductor region are connected by a step side area of the step, which runs essentially perpendicular to the substrate.

12. The semiconductor memory of claim 11, wherein the trapping layer is spaced apart from the step side area and the surface region of the deeper semiconductor region by the gate oxide layer.

13. The semiconductor memory of claim 1, wherein the surface regions of the deeper semiconductor region and of the higher semiconductor region are connected to one another by a deeper step side area, a higher step side area, and an intermediate area extending between the deeper and higher step side areas.

14. The semiconductor memory of claim 13, wherein each of the channel regions are assigned a deeper and a higher one of the trapping layers, the deeper trapping layer being spaced apart from the deeper step side area and the surface region of the deeper semiconductor region by the gate oxide layer, and the higher trapping layer being spaced apart from the higher step side area and the intermediate area by the gate oxide layer.

15. The semiconductor memory of claim 1, wherein the doped deeper contact region extends as far as a step side area of the step.

16. The semiconductor memory of claim 1, wherein N is equal to four.

17. A semiconductor memory, comprising:
a higher semiconductor region;
a deeper semiconductor region, wherein the higher semiconductor region is higher than the deeper semiconductor region relative to a plane defined by a substrate surface;
a step positioned generally normal to the substrate surface, the step being between the higher semiconductor region and the deeper semiconductor region;
a plurality of higher contacts positioned in electrical communication with the higher semiconductor region;
a plurality of deeper contacts positioned in electrical contact with the deeper semiconductor region;
at least one channel region connecting the deeper semiconductor region and the higher semiconductor region, the channel region having a vertical component relative to the horizontally disposed substrate surface;
at least one trapping layer positioned on a gate oxide layer connecting the at least one channel region;
at least one gate electrode configured to control the conductivity of the at least one channel region; and
a control oxide layer positioned between the at least one gate electrode and the at least one trapping layer.

18. The semiconductor memory of claim 17, wherein the plurality of deeper contacts are arranged orthogonal to the plurality of higher contacts.

19. The semiconductor memory of claim 17, wherein the higher semiconductor region extends in mesa longitudinal directions obliquely with respect to a longitudinal direction of the plurality of deeper and higher contacts.

20. The semiconductor memory of claim 17, wherein the surface regions of the deeper semiconductor region and of the higher semiconductor region are connected to one another by a deeper step side area, a higher step side area, and an intermediate area extending between the deeper and higher step side areas.

21. A semiconductor memory, comprising:
a higher semiconductor region;
a deeper semiconductor region, the higher semiconductor region being vertically positioned away from a substrate surface a greater distance than the deeper semiconductor region;
a step positioned generally normal to a substrate surface, the step being positioned between the higher semiconductor region and the deeper semiconductor region;
a plurality of doped higher contacts positioned in electrical communication with the higher semiconductor region;
a plurality of doped deeper contacts positioned in electrical contact with the deeper semiconductor region;
at least one channel region connecting the doped deeper contacts to the plurality of doped higher contacts, the channel region having a vertical component relative to the horizontally disposed substrate surface;
at least one electrically insulating trapping layer positioned on a gate oxide layer connecting to the at least one channel region;
at least one gate electrode configured to control the conductivity of the at least one channel region; and
a control oxide layer positioned between the at least one gate electrode and the at least one trapping layer, wherein the deeper contacts and the higher contacts are arranged in a matrix cell array.

* * * * *